United States Patent
Magni et al.

(10) Patent No.: US 7,291,286 B2
(45) Date of Patent: Nov. 6, 2007

(54) METHODS FOR REMOVING BLACK SILICON AND BLACK SILICON CARBIDE FROM SURFACES OF SILICON AND SILICON CARBIDE ELECTRODES FOR PLASMA PROCESSING APPARATUSES

(75) Inventors: Enrico Magni, Pleasanton, CA (US); Michael Kelly, Pleasanton, CA (US); Robert Hefty, Mountain View, CA (US); Michelle Lupan, Danville, CA (US)

(73) Assignee: Lam Research Corporation, Fremont, CA (US)

( * ) Notice: Subject to any disclaimer, the term of this patent is extended or adjusted under 35 U.S.C. 154(b) by 125 days.

(21) Appl. No.: 11/019,464

(22) Filed: Dec. 23, 2004

(65) Prior Publication Data

US 2006/0157448 A1 Jul. 20, 2006

(51) Int. Cl.
*B44C 1/22* (2006.01)
(52) U.S. Cl. .................. 216/67; 156/345; 134/1.1; 134/1.2; 134/1.3; 216/79
(58) Field of Classification Search .................. 216/67, 216/79; 156/345; 134/1
See application file for complete search history.

(56) References Cited

U.S. PATENT DOCUMENTS

| | | | |
|---|---|---|---|
| 4,426,246 A | 1/1984 | Kravitz et al. | |
| 4,498,953 A | 2/1985 | Cook et al. | |
| 4,595,484 A | 6/1986 | Giammarco et al. | |
| 5,215,619 A * | 6/1993 | Cheng et al. | 156/345.42 |
| 5,565,038 A | 10/1996 | Ashley | |
| 5,585,012 A | 12/1996 | Wu et al. | |
| 5,665,203 A | 9/1997 | Lee et al. | |
| 5,865,896 A * | 2/1999 | Nowak et al. | 118/723 I |
| 5,888,906 A | 3/1999 | Sandhu et al. | |
| 6,033,997 A | 3/2000 | Perng | |
| 6,090,304 A | 7/2000 | Zhu et al. | |
| 6,090,718 A * | 7/2000 | Soga et al. | 438/714 |
| 6,124,211 A | 9/2000 | Butterbaugh et al. | |
| 6,162,367 A | 12/2000 | Tai et al. | |
| 6,290,779 B1 | 9/2001 | Saleh et al. | |
| 6,391,788 B1 | 5/2002 | Khan et al. | |
| 6,394,104 B1 | 5/2002 | Chen et al. | |
| 6,489,249 B1 | 12/2002 | Mathad et al. | |

(Continued)

OTHER PUBLICATIONS

S. Wolf and R.N. Tauber, (Silicon Processing for the VLSI Era, vol. 1- Process Technology, Lattice Press, 1986) pp. 540-541, 545☐☐, 542,546-547.*

(Continued)

*Primary Examiner*—Nadine G. Norton
*Assistant Examiner*—Mahmoud Dahimene
(74) *Attorney, Agent, or Firm*—Buchanan Ingersoll & Rooney PC (57) ABSTRACT

Methods for removing black silicon or black silicon carbide from a plasma-exposed surface of an upper electrode of a plasma processing chamber are provided. The methods include forming a plasma using a gas composition containing a fluorine-containing gas, and removing the black silicon or black silicon carbide from the surface with the plasma. The methods can also remove black silicon or black silicon carbide from surfaces of the components in the chamber in addition to the upper electrode.

22 Claims, 3 Drawing Sheets

U.S. PATENT DOCUMENTS

| | | | |
|---|---|---|---|
| 6,500,356 | B2 | 12/2002 | Goto et al. |
| 6,503,842 | B2 | 1/2003 | Sandhu et al. |
| 6,514,378 | B1 | 2/2003 | Ni et al. |
| 6,527,911 | B1 | 3/2003 | Yen et al. |
| 6,559,049 | B2 | 5/2003 | Chen et al. |
| 6,635,185 | B2 | 10/2003 | Demmin et al. |
| 6,730,600 | B2 | 5/2004 | Layadi et al. |
| 6,776,851 | B1 | 8/2004 | Singh et al. |
| 6,888,224 | B1* | 5/2005 | Kane et al. ............. 257/635 |
| 2003/0190814 | A1* | 10/2003 | Kumar et al. ............ 438/711 |
| 2004/0112294 | A1 | 6/2004 | Allen et al. |
| 2005/0001276 | A1* | 1/2005 | Gao et al. ............... 257/417 |

OTHER PUBLICATIONS

Jeon et al. (Cleaning of wafer edges, bevel and back-side with torus-shaped capacitively coupled plasma, Plasma Sources Sci. Technol. 11 (2002) pp. 520-524 □□.*

Jansen et al. ("The Black Silicon Method" Journal Micromechanical Microengineering, 5 (1995) pp. 115-120) □□.*

Jansen et al. (J. Micromech. Microeng. 5 (1995) pp. 115-120.*

Ibbotson, D.E., et al. "Plasmaless dry etching of silicon with fluorine-containing compounds," J. Appl Phys 56 (10), Nov. 15, 1984, pp. 2939-2942.

Ibbotson, D.E., et al. "Selective interhalogen etching of tantalum compounds and other semiconductor materials," Appl. Phys. Lett. 46 (8), Apr. 15, 1985, pp. 794-796.

Yaws, Carl L., *The Matheson Gas Data Book*, 7$^{th}$ edition, McGraw-Hill (2001).

International Search Report and Written Opinion dated Oct. 27, 2006 for PCT/US05/45541.

International Preliminary Report on Patenability dated Jun. 26, 2007 for PCT/US2005/45541.

* cited by examiner

METHODS FOR REMOVING BLACK SILICON AND BLACK SILICON CARBIDE FROM SURFACES OF SILICON AND SILICON CARBIDE ELECTRODES FOR PLASMA PROCESSING APPARATUSES

BACKGROUND

During the manufacture of semiconductor-based products, such as integrated circuits, etching and/or deposition steps are used to build up or remove layers of material on semiconductor substrates. A conventional etching procedure energizes process gas into a plasma state to plasma etch material on the semiconductor substrate.

Exposed interior surfaces of plasma processing chambers can be modified as a result of the plasma processes that are run within them. Such surface modification can occur due to the flux of energetic ions, photons and various neutral atoms and molecules that are generated by the plasma discharge, as well as from various reactions attendant in the processing of semiconductor substrates in the chambers.

SUMMARY

Methods for removing black silicon and black silicon carbide from surfaces of upper electrodes of parallel-plate plasma processing apparatuses are provided.

A preferred embodiment of a method of removing black silicon or black silicon carbide from a surface of an electrode of a plasma processing chamber is provided, which comprises supplying a fluorine-containing gas composition into a plasma processing chamber including a lower electrode and an upper electrode. The upper electrode is of (i) silicon and includes a plasma-exposed surface having black silicon on the surface, or (ii) of silicon carbide and includes a plasma-exposed surface having black silicon carbide on the surface. As described herein, "black silicon" and "black silicon carbide" are formations that can result from a morphological modification of the plasma-exposed surface of the electrode during plasma etch processing of substrates in the processing chamber. The gas composition is energized to produce plasma and at least a portion of the black silicon or black silicon carbide is etched from the plasma-exposed surface of the upper electrode.

In another preferred embodiment, at least one component of a plasma processing apparatus other than an electrode, which includes a plasma-exposed surface having black silicon or black silicon carbide on the surface, can be subjected to plasma cleaning to etch at least a portion of the black silicon or black silicon carbide from the plasma-exposed surface.

In a preferred embodiment, the gas composition further comprises an oxygen-containing gas and/or an inert gas. Processing conditions, including the ratio of the flow rate of fluorine-containing gas to the flow rate of $O_2$, can be varied to effect isotropic etching of the plasma exposed surface.

In a preferred embodiment, the temperature of the upper electrode can be controlled to a temperature that is effective to provide for a higher rate of removal of black silicon or black silicon carbide.

DETAILED DESCRIPTION OF PREFERRED EMBODIMENTS

Parallel-plate plasma processing chambers include an upper electrode and a lower electrode. The upper electrode has a bottom surface, which typically faces a substrate support on which a semiconductor substrate is supported. These types of plasma processing chambers can be operated to plasma etch various materials, such as dielectric materials provided on semiconductor substrates. During plasma etching processes, an etching gas is supplied into the plasma processing chamber and energized by supplying power to at least one of the electrodes to produce plasma. The processing conditions are chosen so that desired features are etched in materials of the semiconductor substrate.

Parallel-plate plasma processing chambers can include an upper electrode composed, for example, of silicon or silicon carbide. The upper electrode can include a showerhead electrode including gas injection holes for distributing gas in the chamber. The upper electrode can be a one-piece electrode (e.g., a disc-shaped showerhead electrode with gas injection holes), or a multi-piece electrode (e.g., an inner disc-shaped showerhead electrode surrounded by an outer electrode ring, such as a continuous or segmented ring without gas injection holes).

It has been determined that the plasma-exposed bottom surface of the upper electrode can be morphologically modified by the flux of energetic ions, photons and various neutral atoms and molecules that are generated by the plasma discharge, and by various reactions that occur in the processing of semiconductor substrates. A "morphological change" of the bottom surface of the upper electrode is characterized by a change in surface topography, which is caused by non-uniform removal of material across the width of the bottom surface (e.g., across the round bottom surface of a showerhead electrode and/or the optional outer electrode ring). Such non-uniform removal of material from the bottom surface results in different surface regions having different topographies. The morphologically-modified surface is characterized by regions that have micro-roughness as compared to non-modified surface regions.

Figure 1:
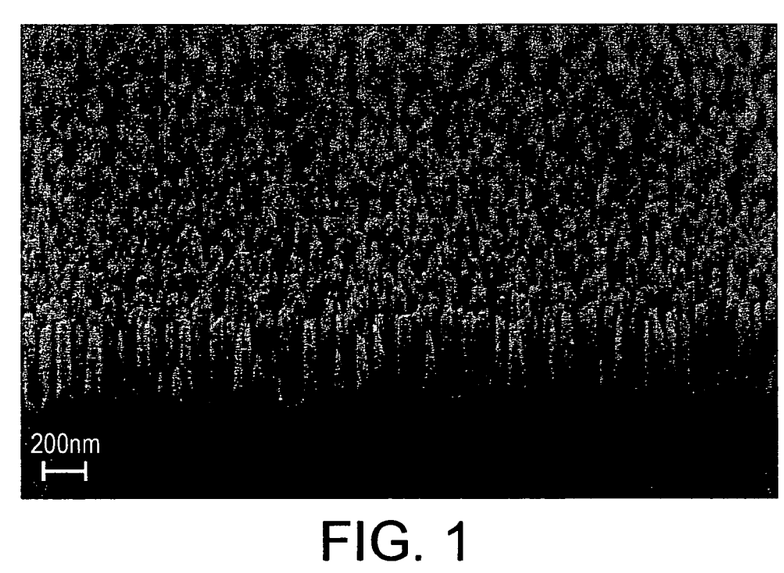
FIG. 1 is a micrograph taken using a scanning electron microscope (SEM) showing a silicon surface having black silicon on the surface.
Figure 2:
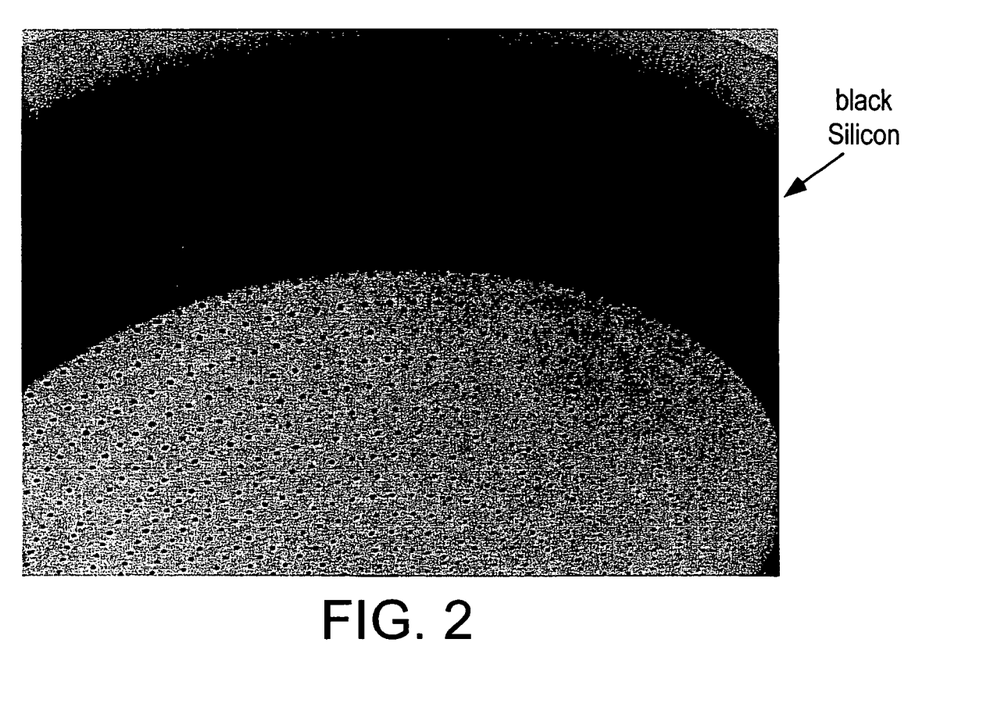
FIG. 2 shows a plasma-exposed surface of a silicon electrode having black silicon on the surface.

A morphological modification of silicon upper electrode surfaces that is characterized by the presence of features that can be needle-like, rod-like or cone-like in shape, has been found to result from certain plasma etching processes and process conditions used in plasma processing chambers containing the electrodes. FIG. 1 shows an SEM micrograph of a morphologically-modified silicon surface including these features. As shown, the needle-like features are closely spaced. The features can typically have a length of from about 10 nm to about 1 mm, and a width of from about 10 nm to about 1000 nm (1 μm). It has also been determined that the length of the needle-like features shown in FIG. 1 increases exponentially with respect to etching time, with the actual time dependency being dependent on the etch process conditions used in the processing chamber. FIG. 2 shows a black silicon formation on a plasma-exposed bottom surface of a silicon outer electrode ring of an upper electrode.

Features like those shown in FIG. 1 have been determined to form on plasma-exposed silicon upper electrode surfaces during plasma etching of dielectric materials, such as low-k dielectric materials, in the chamber. Exemplary process conditions that have been found to be more favorable to the formation of these features include high $N_2$, low $O_2$ and low CF flow rates, and moderate RF power levels used for generating plasma. The morphologically-modified surface of the upper electrode can include one or more modified surface regions, e.g., at least one modified region on the outer electrode ring and/or at least one modified region on the showerhead electrode.

The modified surface morphology that is shown in FIGS. 1 and 2 is commonly referred to as "black silicon." "Black silicon" can form on a plasma-exposed silicon surface as a result of the surface being micro-masked by material deposits formed on the surface during plasma processing operations. The micro-masking can be on the scale of from about 100 nm to about 100 microns.

While not wishing to be bound by any particular theory, it is believed that black silicon formation on the plasma-exposed bottom surface of a silicon upper electrode occurs as a result of non-contiguous polymer deposition on the electrode during plasma processing operations. For example, a non-contiguous polymer deposit can form on the bottom surface of a silicon upper electrode during a main etching step for etching a dielectric material, such as a low-k dielectric material layer, on a semiconductor substrate. The polymer deposits form three-dimensional, island-like formations that protect the underlying silicon surface from etching. Once needle-like features form, for example, polymer deposits form preferentially on the needle tips, thereby accelerating the micro-masking mechanism and black silicon propagation during etching of successive substrates. Non-uniform, anisotropic etching (i.e., in the direction normal to the macroscopic bottom surface of the upper electrode) of the micro-masked surface region(s) results in the formation of closely-spaced features on the bottom surface, such as features having the shapes shown in FIG. 1. These features can prevent light from reflecting from the modified regions of the silicon surface, causing those regions to have a black appearance.

In addition to the formation of black silicon on plasma-exposed silicon surfaces, formations of similar needle-like, rod-like or rod-like features that give modified surface regions a black appearance can also form on plasma-exposed surfaces of silicon carbide electrodes. Such modified regions of a silicon carbide surface are referred to herein as "black silicon carbide."

It is undesirable for either black silicon or black silicon carbide to form on the plasma-exposed surface(s) of an upper electrode of a parallel-plate (e.g., capacitively-coupled) plasma processing chamber because black silicon and black silicon carbide each increase the plasma-exposed surface area of the modified surface. When the extent of the black silicon or black silicon carbide formation becomes "excessive" (i.e., the area(s) of the modified surface region(s) and/or the dimensions of the features reach a certain level), the black silicon or black silicon carbide can cause a variation of the etching plasma properties, resulting in a process shift. Consequently, the plasma etching rate can shift from wafer-to-wafer and/or across a wafer surface during single wafer processing of a batch of wafers in the processing chamber. For example, it has been found that the etch rate of a semiconductor substrate can be significantly lower (e.g., from about 10% to about 20% slower) at the surface regions of the semiconductor substrate that are closer to the regions of the electrode at which black silicon is present. The etch uniformity across the wafer surface can also be significantly degraded by the excessive formation of black silicon or black silicon carbide.

In light of the above-described problems that can result from morphological changes of a plasma-exposed bottom surface of a silicon or silicon carbide upper electrode of a parallel-plate, e.g., capacitively-coupled, plasma processing chamber, it is desirable to remove as-formed black silicon or as-formed black silicon carbide from plasma-exposed surfaces of such electrodes before the extent of the black silicon or black silicon carbide becomes excessive and causes a process shift. In other words, preferably the level of black silicon or black silicon is not allowed to reach an excessive level.

Methods for cleaning a silicon or silicon carbide upper electrode, e.g., a showerhead electrode, or an upper electrode including an inner showerhead electrode and an outer ring, are provided. The methods are performed in-situ in a plasma processing chamber. The upper electrode can have a one-piece or multi-piece construction. The upper electrode is a previously-used electrode that has been used during the plasma processing of semiconductor substrates, e.g., silicon wafers, in the processing chamber. The used electrode has black silicon or black silicon carbide on at least the plasma-exposed bottom surface. The black silicon can be on the bottom surface of the showerhead electrode and/or the bottom surface of the outer ring for two-piece upper electrodes.

It has been determined that once such black silicon or black silicon carbide formations become excessive on silicon or silicon carbide upper electrodes, the cleaning process may not be able to satisfactorily remove the formations, i.e., by restoring the etching rate and etching uniformity of production substrates (wafers) that are subsequently processed in the processing chamber to desired values, e.g., production specifications.

In a preferred embodiment, used electrodes having black silicon or black silicon carbide formations on at least their respective bottom surfaces are plasma cleaned to remove these formations and recover the bottom surface state of the electrodes. The black silicon or black silicon carbide is formed on the upper electrode during plasma etching of semiconductor substrates in the plasma processing chamber. The silicon or silicon carbide upper electrode is preferably plasma cleaned before reaching a level of black silicon or black silicon carbide formation on the plasma-exposed surface that can cause an undesirable process shift during the plasma etching of production wafers using the upper electrode.

More particularly, preferred embodiments of the methods comprise plasma cleaning a plasma-exposed bottom surface of a silicon or silicon carbide upper electrode of a capacitively-coupled plasma processing chamber. The plasma-exposed bottom surface of the upper electrode can be cleaned at a selected time interval, e.g., hourly, daily or weekly; or after a certain number of production wafers has been processed in the chamber while using the upper electrode, e.g., after each production wafer, or after a certain number of wafers have been processed in the chamber, e.g., from 2 to up to about 1000 wafers. In addition, plasma cleaning can be performed after a selected plasma on-time (RF hours) has been reached. The frequency of performance and the duration of the plasma cleaning process each time it is performed can be selected depending on the rate of formation of the black silicon or black silicon carbide during semiconductor substrate etching processes.

The cleaning methods can be performed to remove a selected amount of black silicon or black silicon carbide from the upper electrode. For example, in an embodiment, substantially the entire black silicon or black silicon carbide formation on a surface of an upper electrode can be removed by plasma cleaning.

In another preferred embodiment, a portion of the black silicon or black silicon carbide can be removed such that the extent of the residual black silicon or black silicon carbide on the electrode surface is below a level that can cause an undesirable process shift during the plasma etching of layers, such as dielectric (e.g., low-k) layers on production wafers in the chamber using the as-cleaned upper electrode. The portion of black silicon or black silicon removed is preferably a major portion, i.e., more than 50% of the vertical feature length (i.e., the feature length, or height, in the direction perpendicular to the macroscopic bottom surface of the electrode or a surface of another silicon or silicon carbide component) of the black silicon or black silicon carbide formation is removed, e.g., at least about 60%, 70%, 80%, 90%, 95% or even 100% of the vertical feature length.

For example, based on the estimated amount of black silicon or black silicon carbide that has been removed from the electrode surface (i.e., the estimated change in the average feature length), and on the estimated rate of formation of black silicon or black silicon carbide on the surface during the etching of wafers in the processing chamber using the electrode, the number of wafers that can be processed in the chamber using the as-cleaned upper electrode until an undesirable process shift occurs can be estimated.

The cleaning methods are preferably performed with a dummy wafer positioned in the processing chamber. For example, a bare silicon wafer, or a wafer covered with a film, such as a film of silicon oxide or a photoresist material, can be placed on the substrate support during the cleaning methods.

The cleaning methods remove at least a portion of the morphologically-modified regions of the bottom surface of the upper electrode at which black silicon or black silicon carbide is formed. Particularly, the cleaning is effective to remove at least a portion of the length of the features that give the electrode a black silicon or black silicon carbide appearance. The etching methods can also remove other morphologically-modified regions of the bottom surface of the upper electrode resulting from the flux of energetic ions, photons and neutral atoms and molecules that are generated by the plasma discharge, by the interaction of the bottom surface with chemical reactants present in the plasma processing chamber during plasma processing operations. Polymer deposits on the surface can also be removed.

In a preferred embodiment, the plasma-exposed bottom surface of the silicon or silicon carbide upper electrode is etched by energizing a suitable fluorine-containing gas composition into the plasma state. Preferably, the gas composition comprises at least one fluorocarbon, hydrofluorocarbon, or mixtures thereof. For example, the gas composition can comprise $CH_xF_{4-x}$ (e.g., $CF_4$, $CHF_3$, $CH_2F_2$ or $CH_3F$), $C_2H_xF_{6-x}$ (e.g., $C_2F_6$ or $C_2H_2F_4$), $C_2H_xF_{4-x}$ (e.g., $C_2F_4$), $C_3F_6$, $C_3F_8$, $C_4F_6$, $C_4F_8$, $C_5F_8$, $NF_3$, or mixtures thereof. Preferably, the gas composition comprises $CF_4$ or $NF_3$.

The cleaning gas composition preferably contains at least one additional gas. The additional gas is preferably $O_2$. In other embodiments, the additional gas can be at least one noble gas (e.g., helium, argon or neon). In a preferred embodiment, the gas composition contains $CF_4$ and $O_2$, $CF_4$ and a noble gas (e.g., argon), $NF_3$ and $O_2$, or $NF_3$ and a noble gas. In such gas compositions, the fluorine-containing gas can make up any suitable portion of the total gas composition, including a minor portion (i.e., less than 50% of the total gas composition flow), an equal portion, or a major portion (i.e., more than 50% of the total gas composition flow). Generally, increasing the portion of the fluorine-containing gas in the gas composition increases the fluorine concentration of the gas composition, up to a fluorocarbon concentration of about 50%.

Increasing the fluorine concentration of the cleaning gas composition can increase the efficiency of removal of black silicon from the plasma-exposed bottom surface of the upper electrode. The fluorine concentration of the cleaning gas composition can also be increased by increasing the total flow of the cleaning gas composition. For example, at a given chamber pressure, the fluorine concentration can be increased by changing the flows rates of $CF_4$ (or $NF_3$) and $O_2$ from 125 sccm $CF_4$:125 sccm $O_2$ to, e.g., 500 sccm $CF_4$:500 sccm $O_2$ or 1000 sccm $CF_4$:1000 sccm $O_2$. Other flow ratios of the fluorine-containing gas to $O_2$ or another gas can be used. The fluorine concentration can also be increased by increasing the chamber pressure.

Processing conditions that can produce a high etch rate of black silicon (or black silicon carbide) do not necessarily provide optimal results with respect to black silicon removal. That is, a high silicon etch rate can be achieved under anisotropic etching conditions (i.e., etching in a direction perpendicular to the macroscopic surface of the component, e.g., an upper electrode). However, anisoptropic etching is not optimal for etching black silicon features (or black silicon carbide features) across the width of the bottom surface of an electrode. Rather, black silicon (or black silicon carbide) etching efficiency is achieved when the etching is isotropic and the etch rate is preferably suitably high. It has been determined that etching efficiency can be achieved by increasing the concentration of fluorine free radicals in the plasma.

The flow ratio of the fluorine-containing gas with respect to the other gas(es) in the cleaning gas composition is preferably selected to provide a sufficiently high concentration of the fluorine free radicals in the plasma to achieve isotropic etching of silicon or silicon carbide, and preferably also to provide a suitably high etching rate. For example, for a $CF_4/O_2$ cleaning gas composition, the flow ratio of $CF_4:O_2$ is preferably from about 1:10 to about 5:1, more preferably from about 1:5 to about 2:1. For an $NF_3/O_2$ cleaning gas composition, the flow ratio of $NF_3:O_2$ is preferably from about 1:10 to about 5:1, more preferably from about 1:5 to about 2:1. Increasing the total flow of the cleaning gas composition increases the amount of un-reacted reagent that is available for etching. The $CF_4/O_2$ flow ratio or the $NF_3/O_2$ flow ratio is optimized when an increased amount of F is available in the atomic state. The $NF_3/O_2$ flow ratio or the $NF_3/Ar$ flow ratio is optimized when the F in the atomic state is diluted to limit F—F recombination to form $F_2$. It has been determined that black silicon features having a length of about 500 nm can typically be substantially removed in about 5 minutes of plasma cleaning. Silicon can typically be etched at rates of from about 50 nm to about 300 nm per minute by the in-situ plasma assisted cleaning method.

The total flow of the cleaning gas composition can typically range from about 250 sccm to about 2000 sccm. The chamber pressure can typically range from about 20 mT to about 1000 mT during the cleaning process. The chamber pressure can be adjusted by regulating the position of an optional plasma confinement ring assembly in the processing chamber. Exemplary confinement ring assemblies that can be used are described in commonly-assigned U.S. Pat. Nos. 5,534,751; 5,998,932 and 6,527,911, each of which is incorporated herein by reference in its entirety. The chamber pressure also can be adjusted by controlling the position of a valve, e.g., a throttle valve, located close to a pump, e.g., a turbomolecular pump of the apparatus.

The upper electrode is preferably at a temperature of from about 20° C. to about 200° C., more preferably at an elevated temperature of from about 100° C. to about 200° C. during the cleaning process. It has been determined that increasing the electrode temperature within this range can increase the cleaning efficiency of the electrode in terms of the magnitude of the decrease in average length of the features of black silicon on the plasma-exposed bottom surface. The upper electrode temperature can be controlled in embodiments of the plasma processing chamber that include a showerhead electrode assembly having heating and cooling capabilities. In other embodiments, heat from the electrode caused by ion bombardment can be removed by a heat sink, e.g., one or more metallic plates and/or a temperature-controlled mounting plate, provided in the electrode assembly.

The upper electrode cleaning process is preferably conducted for a sufficient length of time to remove a sufficient thickness from the entire plasma-exposed bottom surface of the upper electrode so that any residual morphologically-modified region(s) on the plasma-exposed bottom surface after cleaning is/are preferably below a level of black silicon or black silicon carbide that can cause an undesirable process shift during the plasma etching of production wafers in the chamber using the as-cleaned upper electrode.

The cleaning methods may introduce a shift in the etch rate performance of the plasma processing chamber. When this occurs, to enhance recovery of the etch rate and etching uniformity performance after cleaning the upper electrode, the plasma processing chamber can optionally be plasma conditioned after the electrode has been cleaned. Depending on the process conditions that are used, the plasma conditioning is capable of removing residual black silicon or black silicon carbide from the upper electrode after the cleaning step has been performed. For example, the plasma chamber conditioning step can generate plasma from a gas composition that contains a fluorine-containing gas, oxygen and a noble gas, such as argon. The fluorine-containing gas can be, for example, $C_4F_8$, and the oxygen-containing gas is preferably $O_2$. The following exemplary approximate process conditions can be used for performing the conditioning step: chamber pressure of 100 mT/2000 W at 27 MHz and 3000 W at 2 MHz applied to lower electrode/20 sccm $C_4F_8$/20 sccm $O_2$/250 sccm argon/120 s plasma conditioning.

In an embodiment, an optional waferless auto clean process can be performed after each production wafer has been etched in the plasma processing chamber, or after two or more (e.g., 2, 5 or 10) production wafers have been etched. The wafer-less auto clean process generates an oxygen plasma effective to remove various deposited materials from plasma-exposed interior surfaces of the chamber. The oxygen plasma is preferably formed by energizing a gas composition containing $O_2$ with no production wafer (i.e., a wafer that is processed to produce a semiconductor-based product) being present in the plasma processing chamber.

In another preferred embodiment, at least one component of a plasma processing apparatus other than an electrode, which is of silicon or silicon carbide and includes a plasma-exposed surface having black silicon or black silicon carbide, respectively, on the surface, can be subjected to plasma cleaning to remove at least a portion of the black silicon or black silicon carbide from the plasma-exposed surface. For example, the component can be one or more edge/focus rings of silicon or silicon carbide for the substrate support that supports a semiconductor substrate.

Figure 3:
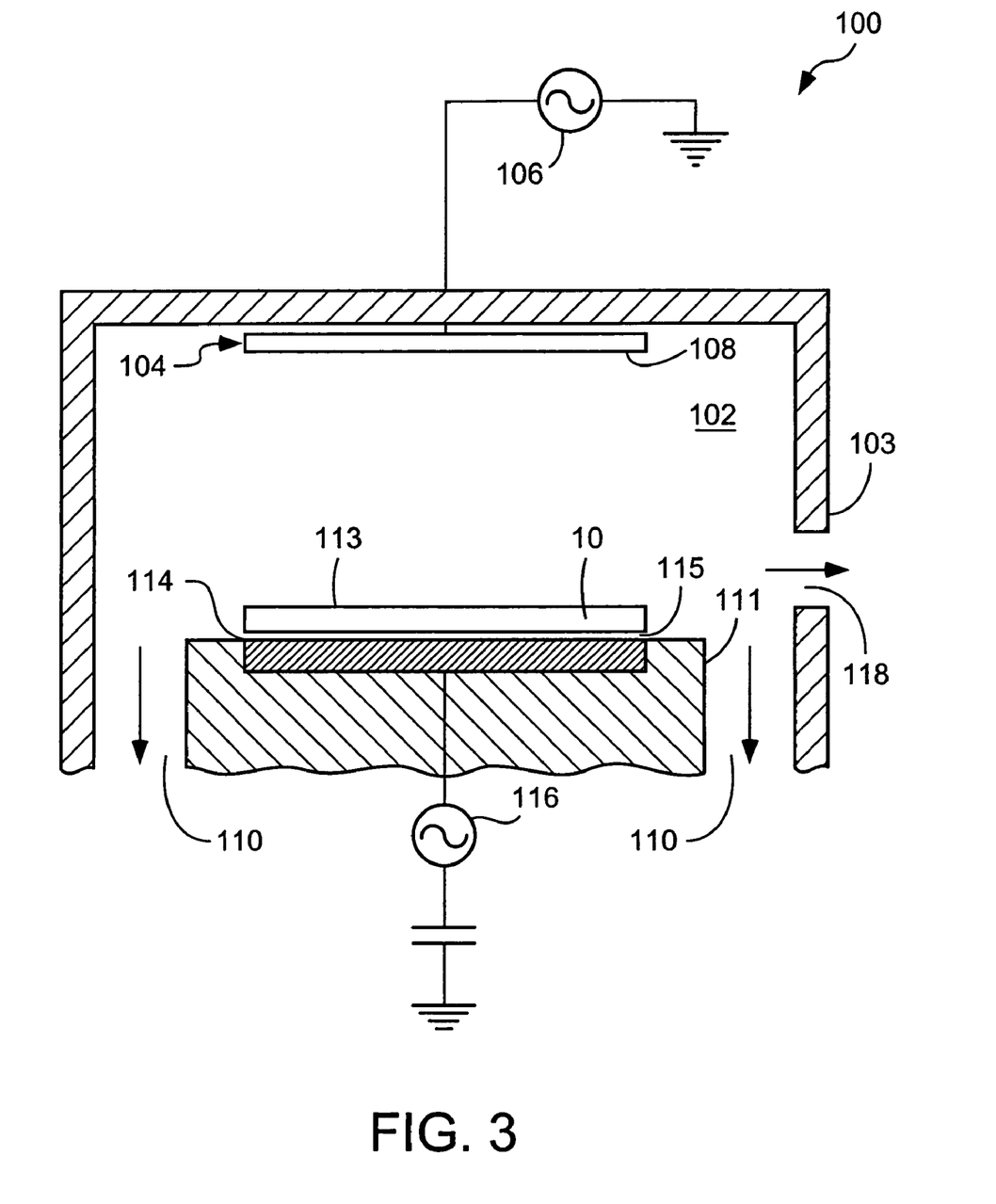
FIG. 3 shows an exemplary capacitively-coupled plasma processing apparatus that is suitable for performing embodiments of the cleaning methods described herein.

FIG. 3 depicts an exemplary plasma processing apparatus 100 that can be used to practice preferred embodiments of the methods described herein. The plasma processing apparatus 100 comprises a capacitively-coupled plasma processing chamber 102, which can generate a medium-density plasma. The plasma processing chamber 102 includes a chamber wall 103. The chamber wall 103 can optionally be coated with a suitable wear-resistant material, such as a plasma-sprayed ceramic material. To provide an electrical path to ground, the chamber wall 103 can be made of aluminum or the like, which is electrically grounded. The plasma processing chamber 102 includes a wafer transfer slot 118 provided in the chamber wall 103 to transfer semiconductor substrates into and out of the plasma processing chamber 102.

The plasma processing chamber 102 includes an upper electrode 104 having a bottom surface 108. The bottom surface 108 is preferably flat with an optional step, as described, for example, in commonly-assigned U.S. Pat. No. 6,391,787, which is incorporated herein by reference in its entirety. The upper electrode 104 can be a single-piece electrode or a multi-piece electrode. For example, the upper electrode 104 can have a single-piece construction including a showerhead electrode plate, or it can include a showerhead electrode plate and an outer electrode ring. In such later embodiments, both the showerhead electrode plate and the outer electrode ring can be optionally backed by a plate of graphite bonded thereto by a bonding material, such as an elastomer material. The upper electrode 104 can be sized to process 200 mm wafers or 300 mm wafers, for example. The upper electrode (including the outer electrode ring in multi-piece constructions) can be of silicon (e.g., single crystalline silicon, polycrystalline silicon or amorphous silicon) or silicon carbide. The apparatus 100 includes a gas source (not shown) for supplying process gas to the upper electrode 104. The upper electrode 104 is preferably powered by an RF power source 106 via a matching network. In another embodiment, the upper electrode 104 can be grounded to provide a return path for power supplied by a bottom electrode of the plasma processing chamber 102, as described below.

In the embodiment of the apparatus 100 shown in FIG. 3, process gas is supplied into the plasma processing chamber 102 at the plasma region developed between the upper electrode 104 and a semiconductor substrate 10, e.g., a semiconductor wafer, supported on a substrate support 111. The substrate support 111 preferably includes an electrostatic chuck 114 that secures the semiconductor substrate 10 on the substrate support by an electrostatic clamping force. The electrostatic chuck 114 acts as a bottom electrode and is preferably biased by an RF power source 116 (typically via a matching network). The upper surface 115 of the electrostatic chuck 114 preferably has approximately the same diameter as the semiconductor substrate 10.

A vacuum pump (not shown) is adapted to maintain a desired vacuum pressure inside the plasma processing chamber 102. Gas is drawn by the pump generally in the direction represented by arrows 110.

An exemplary parallel-plate plasma reactor that can be used is a dual-frequency plasma etch reactor (see, e.g., commonly-assigned U.S. Pat. No. 6,090,304, which is hereby incorporated by reference in its entirety). In such reactors, etching gas can be supplied to a showerhead electrode from a gas supply and a plasma can be generated in the reactor by supplying RF energy from two RF sources to the showerhead electrode and/or a bottom electrode, or the showerhead electrode can be electrically grounded and RF energy at two different frequencies can be supplied to the bottom electrode.

EXAMPLE 1

Four silicon upper electrodes, which had coupons of (100) silicon electrically and thermally bonded to their respective bottom surfaces at different locations, were used for plasma etching of wafers. The bottom surfaces of the electrodes and the coupons had black silicon formations on them. Then, the used electrodes were plasma cleaned in a parallel-plate plasma processing chamber. A dummy wafer was placed on a substrate support during the plasma cleaning.

The process conditions that were used for plasma cleaning the electrodes are shown in Table 1. For each electrode, the plasma cleaning process used a gas composition containing $CF_4$ and $O_2$ and having a $CF_4$ flow rate of 200 sccm, a cleaning time of 60 seconds, and an electrode temperature of about 20° C. The chamber pressure, applied lower electrode power and frequency levels, $O_2$ flow rate, and/or the $CF_4:O_2$ flow rate ratios were varied for the cleaning processes.

For the silicon coupons, the pre-clean black silicon average feature lengths were assumed to have the same estimated value for each electrode. This same estimated length was based on the electrodes each having been subjected to approximately the same plasma etching conditions during which black silicon formed on the coupons and on the electrodes. For each electrode, the post-clean black silicon feature lengths were determined by analyzing the associated coupons using scanning electron microscopy (SEM). As shown in Table 1, the largest difference between the pre-clean and post-clean average black silicon feature length was found for sample no. 1, which was cleaned using a $CF_4/O_2$ flow ratio of 1:2.

TABLE 1

| No. | Chamber Pressure (mT) | Lower Electrode First Power Level/First Frequency (W/MHz) | Lower Electrode Second Power Level/Second Frequency (W/MHz) | $CF_4:O_2$ Flow Rate Ratio | Electrode Temp. (° C.) | Cleaning Time (sec) | Pre-Clean Average Black Si Feature Length (nm) | Post-Clean Average Black Si Feature Length (nm) |
|---|---|---|---|---|---|---|---|---|
| 1 | 600 | 2500/27 | 1000/2 | 1:2 | 20 | 60 | 500 | 200 |
| 2 | 500 | 1000/27 | 2500/2 | 1:9 | 20 | 60 | 500 | 485 |
| 3 | 500 | 1000/27 | 2500/2 | 1:5 | 20 | 60 | 500 | 360 |
| 4 | 600 | 1000/27 | 2500/2 | 1:5 | 20 | 60 | 500 | 260 |

EXAMPLE 2

In Example 2, five silicon upper electrodes, which had coupons of (100) silicon electrically and thermally bonded to their respective bottom surface at different locations, were used for plasma etching of wafers. The bottom surfaces of the electrode and the coupons had black silicon on them. Then, the used electrodes were plasma cleaned in a parallel-plate plasma processing chamber. A dummy wafer was placed on a substrate support during the cleaning processes.

The processing conditions used for plasma cleaning the electrodes are shown in Table 2. For each electrode, the plasma cleaning process used a cleaning gas composition of $CF_4$ and $O_2$ having a $CF_4$ flow rate of 200 sccm, a cleaning time of 5 minutes, and an electrode temperature of about 20° C. The chamber pressure, power and frequency levels applied to the lower electrode, and/or the $CF_4:O_2$ flow rate ratios were varied for cleaning the electrodes.

For the silicon coupons, the pre-clean black silicon average feature lengths were assumed to have the same estimated values for each of the electrodes, as described above with respect to Example 1. The post-clean black silicon feature lengths were determined for the coupons provided on electrode sample nos. 6 and 7 by SEM. No black silicon was observed on sample nos. 5, 8 and 9. It was determined that the process conditions used for sample no. 5, including a $CF_4/O_2$ flow ratio of 1:2, provided the most desirable combination of isotropic etching and black silicon etch rate, based on this sample having a flatter as-cleaned coupon profile.

TABLE 2

| No. | Chamber Pressure (mT) | Lower Electrode First Power Level/First Frequency (W/MHz) | Lower Electrode Second Power Level/Second Frequency (W/MHz) | $CF_4:O_2$ Flow Rate Ratio | Electrode Temp. (° C.) | Cleaning Time (sec) | Pre-Clean Average Black Si Feature Length (nm) | Post-Clean Average Black Si Feature Length (nm) |
|---|---|---|---|---|---|---|---|---|
| 5 | 600 | 2500/27 | 1000/2 | 1:2 | 20 | 300 | 500 | no black Si |
| 6 | 600 | 1000/27 | 2500/2 | 1:2 | 20 | 300 | 500 | 214 |
| 7 | 500 | 2500/27 | 1000/2 | 1:9 | 20 | 300 | 500 | 240 |
| 8 | 500 | 1000/27 | 2500/2 | 1:9 | 20 | 300 | 500 | No black Si |
| 9 | 600 | 1000/27 | 2500/2 | 1:5 | 20 | 300 | 500 | No black Si |

EXAMPLE 3

In Example 3, four silicon upper electrodes were used for plasma etching of wafers and then plasma cleaned in a parallel-plate plasma processing chamber to determine the effect of the fluorine concentration of the cleaning gas on the efficiency of removal of black silicon from the electrodes. Each of electrodes had coupons of (100) silicon electrically and thermally bonded to the bottom surface at different locations. The bottom surfaces of the electrode and the coupons had black silicon formations on them. A dummy wafer was placed on a substrate support during the cleaning processes.

The process conditions that were used for plasma cleaning the electrodes are shown in Table 3. The same cleaning time and electrode temperature were used for each electrode. Different chamber pressures, applied lower electrode power and frequency levels, $CF_4$ flow rates, $O_2$ flow rates, and/or the $CF_4:O_2$ flow rate ratios were used. For sample nos. 10 and 12, the cleaning gas composition contained argon to allow a determination of the fluorine concentration from optical emission using the method of actimetry.

The test results for Example 3 are given in Table 3. As shown, the largest difference between the pre-clean and post-clean average black silicon feature length was achieved for sample no. 12, which was cleaned using a $CF_4/O_2$ flow ratio of 1:2.

Figure 4:
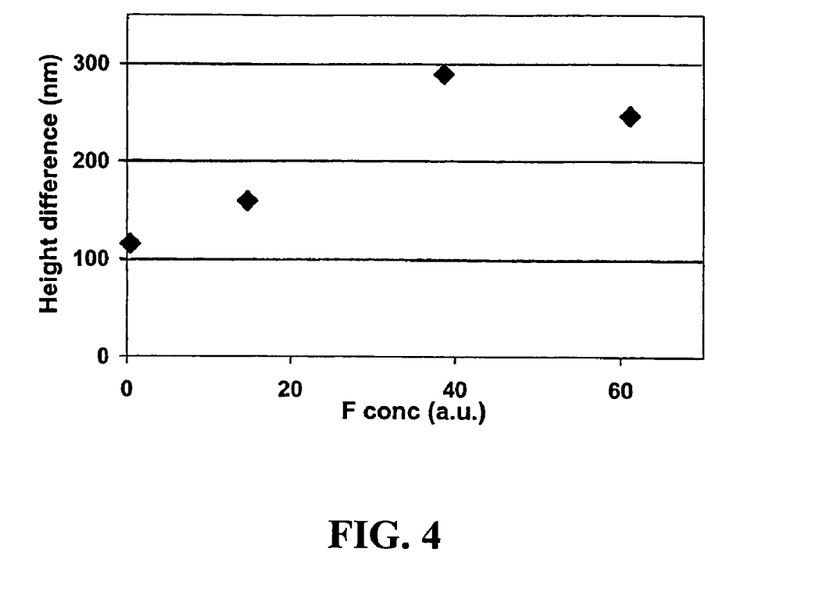
FIG. 4 shows the difference in height between pre-clean black silicon features and post-clean black silicon features versus the fluorine concentration of the cleaning gas composition used for plasma cleaning.

The length difference between the pre-clean black silicon features and the post-clean black silicon features versus the fluorine concentration of the cleaning gas composition is shown in FIG. 4.

EXAMPLE 4

In Example 4, three different silicon upper electrodes that had been used for plasma etching of wafers were plasma cleaned in a parallel-plate plasma processing chamber using the same process conditions except for a different upper electrode temperature. For each of the electrodes, coupons of (100) silicon were electrically and thermally bonded to the bottom surface at different locations. The bottom surfaces of the electrode and the coupons had black silicon formations on them.

The three electrodes were plasma cleaned using the following process conditions: chamber pressure of 600 mT/lower electrode first power level/first frequency of 2500 watts and 27 MHz/lower electrode second power level/second frequency of 1000 watts and 2 MHz/$CF_4$ flow of 200 sccm/$O_2$ flow of 400 sccm/cleaning time of 60 sec. The electrode temperatures were about 20° C., about 80° C. and about 105° C. for the respective electrodes during cleaning. For the temperatures of 20° C., 80° C. and 105° C., the black silicon average feature length was decreased by about 100 nm, about 105 nm and about 140 nm, respectively. These results demonstrate that the electrode cleaning efficiency can be improved by increasing the electrode temperature to at least about 100° C.

EXAMPLE 5

In Example 5, 100 wafers each including a low-k silicon oxide layer were subjected to an etch step in a parallel-plate plasma processing chamber using a silicon upper electrode.

TABLE 3

| No. | Chamber Pressure (mT) | Lower Electrode First Power Level/First Frequency (W/MHz) | Lower Electrode Second Power Level/Second Frequency (W/MHz) | $CF_4:O_2:Ar$ Flow Rates (sccm) | Electrode Temp. (° C.) | Cleaning Time (sec) | Pre-Clean Average Black Si Feature Length (nm) | Post-Clean Average Black Si Feature Length (nm) |
|---|---|---|---|---|---|---|---|---|
| 10 | 50 | 2000/27 | 3000/2 | 200:50:50 | 20 | 60 | 580 | 460 |
| 11 | 200 | 1000/27 | 2500/2 | 200:400:0 | 20 | 60 | 460 | 300 |
| 12 | 500 | 2000/27 | 3000/2 | 83:167:50 | 20 | 60 | 480 | 190 |
| 13 | 600 | 1000/27 | 2500/2 | 200:400:0 | 20 | 60 | 480 | 240 |

Figure 5:
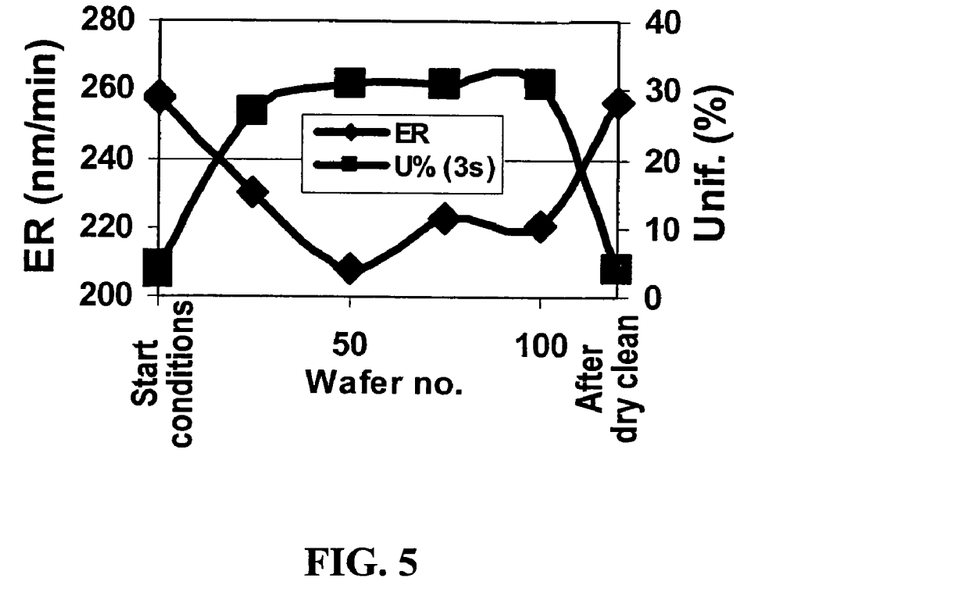
FIG. 5 shows the silicon oxide etch rate and etch rate uniformity at the start, after etching 25, 50, 75 and 100 wafers, respectively, and subsequently after cleaning the upper electrode of the plasma processing chamber according to an embodiment of the methods described herein.

After the 100 wafers had been processed, the silicon upper electrode was cleaned using the following process conditions: chamber pressure of 600 mT/lower electrode first power level/first frequency of 2500 watts and 27 MHz/lower electrode second power level/second frequency of 1000 watts and 2 MHz/$CF_4$ flow of 200 sccm/$O_2$ flow of 400 sccm/cleaning time of 15 minutes. As shown in FIG. 5, the silicon oxide etch rate and etch rate % uniformity (3 sigma) were determined at the start, after 25, 50, 75 and 100 wafers, respectively, were etched, and after cleaning of the upper electrode following the etching of all 100 wafers. The test results demonstrate that both the upper electrode bottom surface condition and the silicon oxide etch rate can be recovered by cleaning the upper electrode according to an embodiment of the methods described herein.

EXAMPLE 6

In Example 6, a first silicon upper electrode including black silicon having an average feature length of about 500 nm was plasma cleaned using the following process conditions: chamber pressure of 200 mT/lower electrode first power level/first frequency of 2500 watts and 27 MHz/lower electrode second power level/second frequency of 1000 watts and 2 MHz/$CF_4$ flow of 200 sccm/$O_2$ flow of 400 sccm/electrode temperature of 20° C./cleaning time of 30 sec. The post-clean black silicon average feature length was about 460 nm. A second silicon upper electrode including black silicon having an average feature length of about 430 nm was plasma cleaned using the following process conditions: chamber pressure of 200 mT/lower electrode first power level/first frequency of 2500 watts and 27 MHz/lower electrode second power level/second frequency of 1000 watts and 2 MHz/$NF_3$ flow of 200 sccm/$O_2$ flow of 400 sccm/cleaning time of 30 sec. The post-clean average feature length was about 360 nm. These test results demonstrate that $CF_4/O_2$ and $NF_3/O_2$ gas mixtures are both effective for removing black silicon, with an $NF_3/O_2$ gas mixture being even more effective.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A method of removing black silicon or black silicon carbide from a surface of a used electrode of a plasma processing chamber, the method comprising:
   supplying a fluorine-containing gas composition into a plasma processing chamber including a lower electrode and an upper electrode, the upper electrode being of (i) silicon and including a plasma-exposed surface having black silicon on the surface, or (ii) of silicon carbide and including a plasma-exposed surface having black silicon carbide on the surface;
   energizing the gas composition to produce plasma; and
   etching at least a portion of the black silicon or black silicon carbide from the plasma-exposed surface of the upper electrode.

2. The method of claim 1, wherein the plasama processing chamber is a parallel-plate, capacitively-coupled chamber and the upper electrode includes a showerhead electrode and a segmented outer electrode ring each made of single crystal silicon, polycrystalline silicon or amorphous silicon.

3. The method of claim 1, wherein the fluorine containing gas is selected from the group consisting of $CF_4$, $CHF_3$, $CH_2F_2$, $CH_3F$, $C_2F_6$, $C_2H_2F_4$, $C_2F_4$, $C_3F_6$, $C_3F_8$, $C_4F_6$, $C_4F_8$, $C_5F_8$, $NF_3$, or mixtures thereof.

4. The method of claim 1, wherein the gas composition consists essentially of $CF_4$ and $O_2$ or of $NF_3$ and $O_2$.

5. The method of claim 1, wherein:
   the gas composition consists essentially of $CF_4$ and $O_2$, and the ratio of the flow rate of $CF_4$ to the flow rate of $O_2$ is from about 1:10 to about 5:1; or
   the gas composition consists essentially of $NF_3$ and $O_2$, and the ratio of the flow rate of $NF_3$ to the flow rate of $O_2$ is from about 1:10 to about 5:1.

6. The method of claim 5, wherein the ratio of the flow rate of $CF_4$ to the flow rate of $O_2$, or the ratio of the flow rate of $NF_3$ to the flow rate of $O_2$, is from about 1:5 to about 2:1.

7. The method of claim 6, wherein the total flow of the gas composition is from about 250 sccm to about 2000 sccm, and the plasma processing chamber is at a pressure of from about 20 mTorr to about 1000 mTorr.

8. The method of claim 1, wherein the gas composition is energized by supplying two different power levels at two different frequencies to the lower electrode while grounding the upper electrode.

9. The method of claim 1, wherein the plasma-exposed surface of the upper electrode is isotropically etched.

10. The method of claim 1, wherein the temperature of the upper electrode is from about 50° C. to about 200° C. during the etching.

11. The method of claim 1, further comprising:
    plasma etching a plurality of semiconductor substrates including a low-k dielectric layer in the plasma processing chamber, wherein the black silicon or black silicon carbide is formed on the plasma-exposed surface of the upper electrode during plasma etching of the low-k dielectric layers.

12. The method of claim 1, wherein the etching removes a depth of from about 50 nm to about 500 nm from the plasma-exposed surface of the upper electrode.

13. The method of claim 1, further comprising etching black silicon from a silicon component, or removing black silicon carbide from a silicon carbide component, in addition to the upper electrode, in the plasma processing chamber.

14. A method of removing black silicon from a surface of a used electrode of a capacitively-coupled plasma processing chamber, the method comprising:
    supplying a gas composition comprising $CF_4$ and $O_2$ or $NF_3$ and $O_2$ into a plasma processing chamber at (i) a ratio of the flow rate of $CF_4$ to the flow rate of $O_2$ or (ii) a ratio of the flow rate of $NF_3$ to the flow rate of $O_2$ of from about 1:10 to about 5:1, the plasma processing chamber including a lower electrode and an upper electrode of silicon having a plasma-exposed surface with black silicon on the surface;
    energizing the gas composition to produce a plasma; and
    isotropically etching at least a portion of the black silicon from the plasma-exposed surface of the upper electrode.

15. The method of claim 14, comprising removing a depth of from about 50 nm to about 500 nm from the plasma-exposed surface of the upper electrode.

16. The method of claim 14, wherein the upper electrode includes a showerhead electrode and an outer electrode ring each made of single crystal silicon, polycrystalline silicon or amorphous silicon.

17. The method of claim 14, wherein the temperature of the upper electrode is from about 50° C. to about 200° C. during the etching.

18. The method of claim 14, wherein the ratio of the flow rate of $CF_4$ to the flow rate of $O_2$, or the ratio of the flow rate of $NF_3$ to the flow rate of $O_2$, is from about 1:5 to about 2:1.

19. The method of claim 18, wherein the total flow of the gas composition is from about 250 sccm to about 2000 sccm, and the plasma processing chamber is at a pressure of from about 20 mTorr to about 1000 mTorr.

20. The method of claim 14, wherein the gas composition is energized by supplying two different power levels at two different frequencies to the lower electrode while grounding the upper electrode.

21. The method of claim 1, wherein:
the upper electrode is of single crystal silicon and includes a plasma-exposed bottom surface having black silicon on the bottom surface; and
the etching etches at least a portion of the black silicon from the plasma-exposed bottom surface of the upper electrode.

22. The method of claim 1, wherein:
the upper electrode is of single crystal silicon carbide and includes a plasma-exposed bottom surface having black silicon carbide on the bottom surface; and
the etching etches at least a portion of the black silicon carbide from the plasma-exposed bottom surface of the upper electrode.

* * * * *